US012813171B2

(12) United States Patent
Hong et al.

(10) Patent No.: US 12,813,171 B2
(45) Date of Patent: Nov. 24, 2026

(54) MEMORY DEVICE WITH SWITCHING CHARACTERISTICS AND METHOD OF OPERATION THEREOF

(71) Applicant: IHW Inc., Yongin-si (KR)

(72) Inventors: Seok Man Hong, Seoul (KR); Sung Lae Cho, Gwacheon-si (KR); Sang Hoon Yoon, Seongnam-si (KR)

(73) Assignee: IHW Inc., Yongin-si (KR)

( * ) Notice: Subject to any disclaimer, the term of this patent is extended or adjusted under 35 U.S.C. 154(b) by 100 days.

(21) Appl. No.: 19/059,996

(22) Filed: Feb. 21, 2025

(65) Prior Publication Data

US 2025/0275492 A1 Aug. 28, 2025

(30) Foreign Application Priority Data

Feb. 28, 2024 (KR) ........................ 10-2024-0029251

(51) Int. Cl.
*H10N 70/00* (2023.01)
*G11C 13/00* (2006.01)
*H10B 63/00* (2023.01)

(52) U.S. Cl.
CPC ......... *H10N 70/882* (2023.02); *G11C 13/004* (2013.01); *G11C 13/0069* (2013.01); *H10B 63/84* (2023.02); *H10N 70/8845* (2023.02)

(58) Field of Classification Search
CPC ............. H10N 70/882; H10N 70/8845; H10N 70/826; H10N 70/00; G11C 13/004; G11C 13/0069; G11C 2013/0092; G11C 13/0004; H10B 63/84; H10B 63/00; H10B 63/24
USPC .......................................................... 365/148
See application file for complete search history.

(56) References Cited

U.S. PATENT DOCUMENTS

| | | | | |
|---|---|---|---|---|
| 9,786,807 | B2 * | 10/2017 | Chirila | H10F 71/00 |
| 2018/0219113 | A1 * | 8/2018 | Farshchi | C23C 14/0057 |
| 2024/0099094 | A1 * | 3/2024 | Kim | H10K 59/38 |
| 2025/0248196 | A1 * | 7/2025 | Son | C01G 15/006 |

FOREIGN PATENT DOCUMENTS

| | | |
|---|---|---|
| KR | 10-2022-0059879 A | 5/2022 |
| KR | 10-2022-0083726 A | 6/2022 |
| KR | 10-2023-0061289 A | 5/2023 |
| KR | 10-2023-0076760 A | 5/2023 |

OTHER PUBLICATIONS

"Office Action for Korean Patent Application No. 10-2024-0029251" dated Feb. 28, 2025, KIPO, Republic of Korea.

* cited by examiner

*Primary Examiner* — Fernando Hidalgo
(74) *Attorney, Agent, or Firm* — Bridgeway IP Law Group, PLLC; Jihun Kim

(57) ABSTRACT

Embodiments provide a memory device having both switching characteristics and memory characteristics and capable of reducing the complexity of peripheral devices and reducing power consumption, and an operating method thereof. In order to achieve the object, there may be provided a memory device including a chalcogenide compound layer, in which the chalcogenide compound layer includes a first element selected from the group consisting of Al, Ga, In, and a combination thereof, and a second element selected from the group consisting of S, Se, Te, and a combination thereof, an atomic molar ratio of the first element is in a range of 1 to 15 atom %, and a resistance changes depending on different pulse waveforms of the same polarity that are applied to simultaneously have switching characteristics.

13 Claims, 9 Drawing Sheets

<R-I>

<I-V>

MEMORY DEVICE WITH SWITCHING CHARACTERISTICS AND METHOD OF OPERATION THEREOF

CROSS REFERENCE TO RELATED APPLICATION

The present application claims priority to Korean Patent Application No. 10-2024-0029251, filed Feb. 28, 2024, the entire contents of which are incorporated here for all purposes by this reference.

BACKGROUND OF THE INVENTION

1. Field of the Invention

The present invention relates to a memory device with switching characteristics, and more particularly, to a memory device including a chalcogenide compound layer having switching characteristics of a selector and having memory characteristics by changing resistance depending on different pulse waveforms of the same polarity that are simultaneously applied, and a method of operating the same.

2. Description of the Related Art

With recent active development of artificial intelligence semiconductors, the importance of in-memory computing is being emphasized to overcome the bottleneck caused by the Von-Neumann architecture. To this end, much research has been conducted on new non-volatile memories until recently. In particular, research and development is actively being conducted on memory device technology that introduces a crossbar array structure capable of configuring high-density memory cells for storing a large amount of information.

The crossbar array structure may cause sneak current, which is an unexpected current flow through unselected low-resistance cells other than the selected memory cell. The sneak current causes operational problems such as misreading, misrecording, or the like. In order to control the sneak current, a selector is used by being connected in series with a memory device, and has the characteristic of showing rapid resistance changes above and below a certain threshold voltage. In this way, a function of preventing selection of a memory device at a threshold voltage or lower and ensuring that the memory device is selected only above that voltage is provided. A crossbar array structure according to the related art is shown in FIG. 1.

However, in order to maximize the advantages of the crossbar array for high integration of memory devices, a unit element of the high performance/high reliability of a two-terminal form factor is not only developed but also a structural aspect ratio is reduced, and thus, the demand for reducing the process burden for the production of planar or vertical crossbar arrays is increasing. As shown in FIG. 1, in the memory device in the related art, as the selector and the memory device are connected in series, the process cost for the connecting increases, and as the aspect ratio increases, stacking in a vertical direction becomes difficult.

In order to solve the problems, selector-only memory (SOM), which may form a crossbar array with only a unit element having variable threshold voltage characteristics rather than a structure that includes the memory device and the selector that an existing unit element has, is attracting attention ("Extremely high performance, high density 20 nm self-selecting cross-point memory for Compute Express Link", 2022 IEEE International Electron Device Meeting (IEDM), December 2022). In the related art, a phase-change memory device is used together with a selector connected in series to enable selection of memory devices in a memory array. The selector is a chalcogenide compound and may facilitate the selection of the phase-change memory device through their switching characteristics that cause rapid resistance changes before and after a threshold voltage.

However, recent studies have found that as some of the chalcogenide compound selectors may exhibit different resistance states at the same applied voltage, the chalcogenide selectors have memory characteristics as well as switching characteristics, and as a result, the development of memory devices using the memory characteristics is actively underway.

In order to store logic states of the SOM devices, the SOM devices have to be able to have different resistance states in the same voltage range applied for reading, and to this end, for a high resistance state, a voltage of the opposite polarity to an applied voltage for reading is applied, and for a low resistance state, a voltage of the same polarity as an applied voltage for reading is applied (US Publication No. 2017-0125097).

However, there is an unavoidable problem that peripheral devices increase and complexity thereof increases as voltages of different polarities are applied to store the logic states.

SUMMARY OF THE INVENTION

The invention is directed to providing a memory device having both switching characteristics and memory characteristics and capable of reducing the complexity of peripheral devices and reducing power consumption, and an operating method thereof.

A According to one aspect of the invention, there is provided a memory device including a chalcogenide compound layer, in which the chalcogenide compound layer comprises a first element selected from the group consisting of Al, Ga, In, and a combination thereof, and a second element selected from the group consisting of S, Se, Te, and a combination thereof, an atomic molar ratio of the first element is in a range of 1 to 15 atom %, and a resistance changes depending on different pulse waveforms of the same polarity that are applied to simultaneously have switching characteristics.

In addition, in the memory device according to one embodiment of the invention, the chalcogenide compound layers may be stacked in a multilayer structure.

In addition, in the memory device according to one embodiment of the invention, an intermediate layer including one or both of Ge and Si may be disposed between the chalcogenide compound layers of the multilayer structure.

In addition, in the memory device according to one embodiment of the invention, an amorphous carbon layer may be disposed between the chalcogenide compound layers of the multilayer structure.

In addition, in the memory device according to one embodiment of the invention, the chalcogenide compound layer may further include one or both of Ge and Si, and a sum of Ge and Si may be greater than 0 and less than or equal to 5 atom %.

In addition, in the memory device according to one embodiment of the invention, the atomic molar ratio of the first element may be 5 to 10 atom %.

In addition, in the memory device according to one embodiment of the invention, the first element may be In and the second element may be Te.

In addition, in the memory device according to one embodiment of the invention, the selector may have a first resistance when the pulse waveform is a square pulse, the selector may have a second resistance when the pulse waveform is a trailing pulse, and the first resistance may be lower than the second resistance.

Meanwhile, according to another aspect of the invention, there is provided a method of operating a memory device including a chalcogenide compound layer including a first element selected from the group consisting of Al, Ga, In, and a combination thereof, and a second element selected from the group consisting of S, Se, Te, and a combination thereof, an atomic molar ratio of the first element being 1 to 15 atom %, including writing a first logic state by applying a square pulse of a first polarity to the memory device and writing a second logic state by applying a trailing pulse of a first polarity to the memory device, in which a resistance of the first logic state is smaller than a resistance of the second logic state.

In addition, in the method according to one embodiment of the invention, a voltage drop time in the trailing pulse may be in a range of 50 ns to 500 μs.

In addition, in the method according to one embodiment of the invention, the resistance of the first logic state may be changed by changing a current size or the pulse number of the square pulses applied in the writing of the first logic state.

In addition, the method according to one embodiment of the invention may include reading by applying a reading voltage that is lower than or equal to a threshold voltage of the memory device in the first logic state and has the first polarity to the memory device in which the first or second logic state is written.

DETAILED DESCRIPTION OF THE EXEMPLARY EMBODIMENTS

Figure 1:
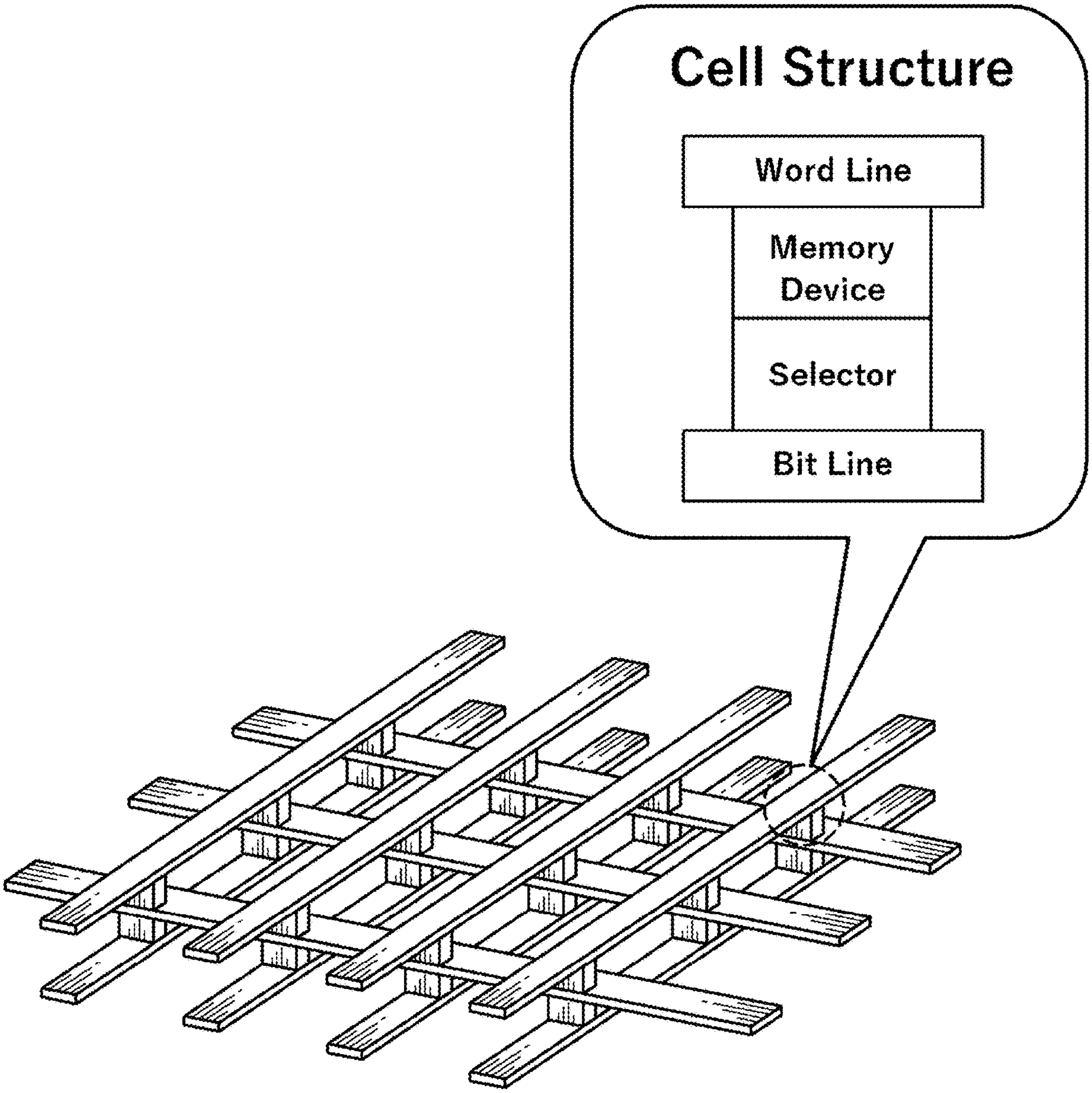
FIG. 1 is a conceptual diagram of a memory device having a cross-point structure according to the related art.
Figure 2:
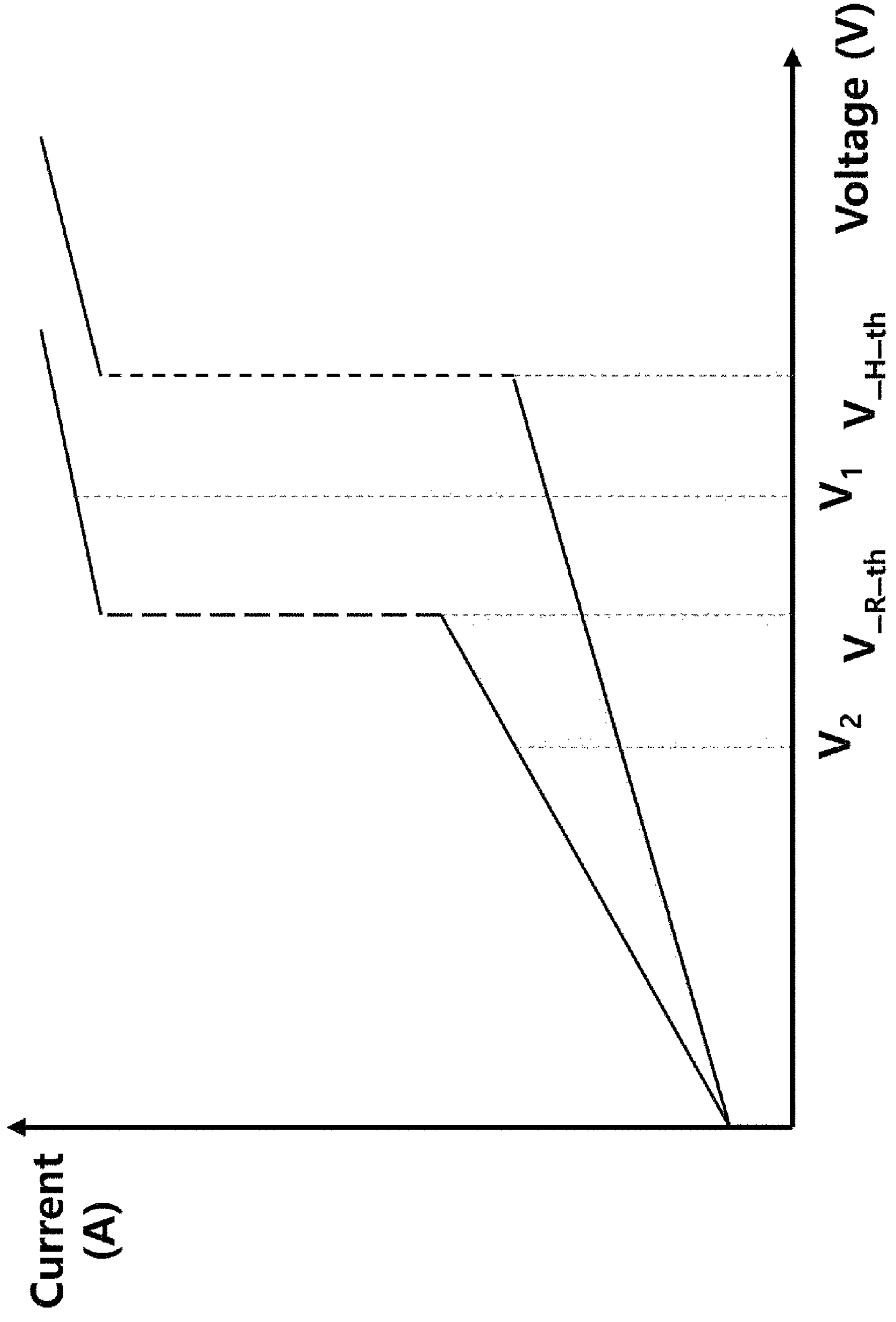
FIG. 2 is an I-V curve for describing an applied voltage of a reading step in the operation of a memory device according to one embodiment of the invention.

Hereinafter, embodiments of the invention will be described in detail with reference to the accompanying drawings so that those skilled in the art may easily perform the invention. However, the invention may be implemented by various modifications and is not limited to the embodiments described herein.

In addition, in the drawings, in order to clarify the invention, parts that are not related to description are omitted and like reference numerals represent like elements throughout the specification.

Throughout the specification of the invention, when a part "comprises" an element, unless described to the contrary, the term "comprises" does not indicate that the part excludes another element but instead indicates that the part may further include the other element.

The terms "approximately," "substantially," etc., used herein, which indicate the extent, are used in the sense of, when the manufacturing and material tolerances inherent in the stated circumstances are presented, "at, nearly at the numerical values, and used to prevent unscrupulous infringers from unfairly exploiting the disclosure, which precise or absolute numerical values are stated in order to aid understanding of the invention. In addition, throughout the specification of the invention, "a step of . . . ing" or a "step of" does not mean "step for . . . "

Throughout the specification of the invention, the term "a combination thereof" included in the expressions in Makushi type description means a mixture or combination of one or more selected from the group consisting of components described in the expressions in Markush type, and thus term includes one or more selected from the group consisting of the components.

Throughout the specification of the invention, the term "A and/or B" means "A or B, or A and B."

In addition, unless otherwise defined, all technical and scientific terms have the same meaning as commonly understood by one of ordinary skill in the art to which the invention belongs. The terminology used herein is for the purpose of effectively describing particular embodiments only and is not intended to be limiting of the invention. In addition, the unit of compounds not specifically described in the specification may be atom %.

According to the invention, in a memory device including a chalcogenide compound layer, the chalcogenide compound layer includes a first element selected from the group consisting of Al, Ga, In, and a combination thereof, and a second element selected from the group consisting of S, Se, Te, and a combination thereof, an atomic molar ratio of the first element is in a range of 1 to 15 atom %, and a resistance changes depending on different pulse waveforms of the same polarity that are applied to simultaneously have switching characteristics of the selector.

Since selector-only memory (SOM) devices have simple structure and excellent drift characteristics, in recent years, the development thereof has bene actively made. However, to make the SOM device work, especially in a writing method to cause a change in resistance, voltages of different polarities are applied. In order to apply the different polarities, a very complex peripheral circuit is required, and an area of the device increases, which inevitably increases manufacturing costs.

The chalcogenide compound layer of the SOM device according to the invention has a specific composition, so that a resistance state may be changed by changing the waveforms of pulses applied at the same polarity, thereby enabling utilization as a memory device. Accordingly, manufacturing costs may be reduced by applying the same polarity at a writing operation.

Meanwhile, the SOM device also has switching characteristics that cause rapid resistance changes before and after the threshold voltage, which is a characteristic of a selector, so that the SOM device has both the characteristics of the selector and the characteristics of the memory device.

The composition of the chalcogenide compound layer may include a first element that is Al, Ga, and In, which are group 3 elements, and a combination thereof, and a second element that is S, Se, and Te, which are group 6 element, and a combination thereof.

Therefore, the composition of the SOM device according to the invention may be any one of In—Te, In—Se, In—S—Te, In—S—Se, Al—Te, Al—Se, Al—S—Te, Al—S—Se, Ga—Te, Ga—Se, Ga—S—Te, Ga—S—Se, In—Al—Te, In—Al—Se, In—Al—S—Te, In—Al—S—Se, In—Ga—Te, In—Ga—Se, In—Ga—S—Te, In—Ga—S—Se, Al—Ga—Te, Al—Ga—Se, Al—Ga—S—Te, Al—Ga—S—Se, In—Al—Ga—Te, In—Al—Ga—Se, In—Al—Ga—S—Te, and In—Al—Ga—S—Se, but the invention is not limited thereto.

In particular, in the SOM device according to the invention, the chalcogenide compound layer has a content of the first element of 1 to 15 atom %, and with this composition, the resistance state may be changed by applying voltages with the same polarity. On the other hand, when a proportion of the second element is excessively high, it becomes difficult to significantly increase a difference in resistance state. Therefore, a preferred composition ratio of the first element may be in a range of 1 to 15 atom %, and more preferably in a range of 5 to 10 atom %.

In addition, in the SOM device according to the invention, the chalcogenide compound layer may further include one or both of Ge and Si, and the sum of Ge and Si may be greater than 0 and less than or equal to 5 atom %. By including Ge or Si, endurance characteristics may be improved. However, when too many of the elements are included, drift characteristics appear, which is not desirable.

In addition, the SOM device according to the invention may have the chalcogenide compound layers stacked in a multilayer structure. By stacking multiple chalcogenide compound layers of the same or different compositions, a resistance ratio between a low resistance state and a high resistance state may be significantly adjusted or various characteristics may be adjusted. An amorphous carbon film may be disposed between the chalcogenide compound layers of the multilayer structure.

In particular, an intermediate layer including one or both of Ge and Si may be disposed between the chalcogenide compound layers of the multilayer structure, and the endurance characteristics may be improved through the intermediate layer.

Meanwhile, in the SOM device according to the invention, the chalcogenide compound layer may have different resistance states even when pulses of the same polarity are applied, and by using it, it is possible to store logic states. The change in the resistance state appears depending on waveforms of the applied pulses even with the same polarity. When the pulse waveform is a square pulse, the chalcogenide compound is the first resistance state, which is the low resistance state, and when the pulse wave is a trailing pulse, the chalcogenide compound is the second resistance state, which is the high resistance state.

In contrast, in a phase-change memory using a similar chalcogenide compound, when the pulse of the applied voltage is a square pulse, the chalcogenide compound enters an amorphous state, which is the high resistance state, whereas the chalcogenide compound layer according to the invention enters the low resistance state. This is because the phase-change memory device changes its resistance state through a change between the amorphous and crystalline phases of a material, whereas the chalcogenide compound layer according to the invention is complexly affected by factors such as a distribution of atoms, a short-range order, whether or not there is partial crystallization, and the like.

In addition, in order to maintain the high resistance state for the chalcogenide compound layer in the SOM device according to one embodiment of the invention, the applied trailing pulse may have a voltage drop time of 50 ns or longer. The voltage drop time equal to or greater than a certain level is required for the chalcogenide compound layer to enter the high resistance state. On the other hand, when the voltage drop time is 500 μs or longer, an operating time becomes longer, which is not desirable. The voltage drop time is more preferably in a range of 1 μs to 500 μs, and even more preferably in a range of 5 μs to 200 μs.

In an operating method for the SOM device according to the invention, a writing operation of storing a logic state may include an operation of writing a first logic state by applying a square pulse of a first polarity to the SOM device as described above, and an operation of writing a second logic state by applying a trailing pulse of a first polarity to the SOM device. Here, the resistance in the first logic state becomes smaller than the resistance in the second logic state, so that the logic state may be stored.

In addition, when the trailing pulse of the first polarity is applied, the resistance in the first logic state may be varied by changing the size of the applied current or the number of applied pulses. Increasing the current size or the number of trailing pulses may further reduce the resistance in the first logic state of the SOM device.

Meanwhile, the resistance in the first logic state may be controlled to be gradually lowered by increasing the size of the current stepwise as the number of applied square pulses increases.

As the resistance in the first logic state may be changed in this way, various logic states may be stored, thereby increasing the possibility of application to semiconductor devices for analog operations.

Meanwhile, in the operating method for the SOM device according to the invention, a reading method may include an operation of reading the logic state by applying a voltage lower than or equal to the threshold voltage of the memory device in the first logic state to the SOM device in which the first or second logic state is written.

In general, in a method of reading a logic state of a phase-change memory, a resistance-change memory, or a SOM device, the logic states of the memory devices are read by applying a voltage V1 that exceeds a threshold voltage $V_{\_R\_th}$ of a memory device in a low resistance state and is lower than a threshold voltage $V_{\_H\_th}$ of a memory device in a high resistance state, as shown in the I-V curve of FIG. 1, so that the memory device in the low resistance state is turned on (selected) to allow a high current to flow, and the memory device in the high resistance state is turned off (not selected) to allow a low current to flow, thereby increasing the resistance ratio. However, this method is not desirable in terms of power consumption since too high a current flows when the logic state of the memory device in the low resistance state is read.

In comparison, in the invention, by applying the reading voltage as a voltage V2 lower than the threshold voltage $V_{\_R\_th}$ of the memory device in the low resistance state, the logic state according to the resistance state may be recognized and determined in a low current range at the threshold voltage or lower, thereby significantly reducing power consumption.

Example 1

The thickness of the back electrode connection (BEC) was set to 40 to 80 nm, and an InTe film was deposited by disposing an In target and a Te target through sputtering. The thickness of the InTe film produced in this way was set to 50 nm, and a composition ratio of the final InTe film was In:Te=9.4:91.6 on an atom % basis.

Figure 3A:
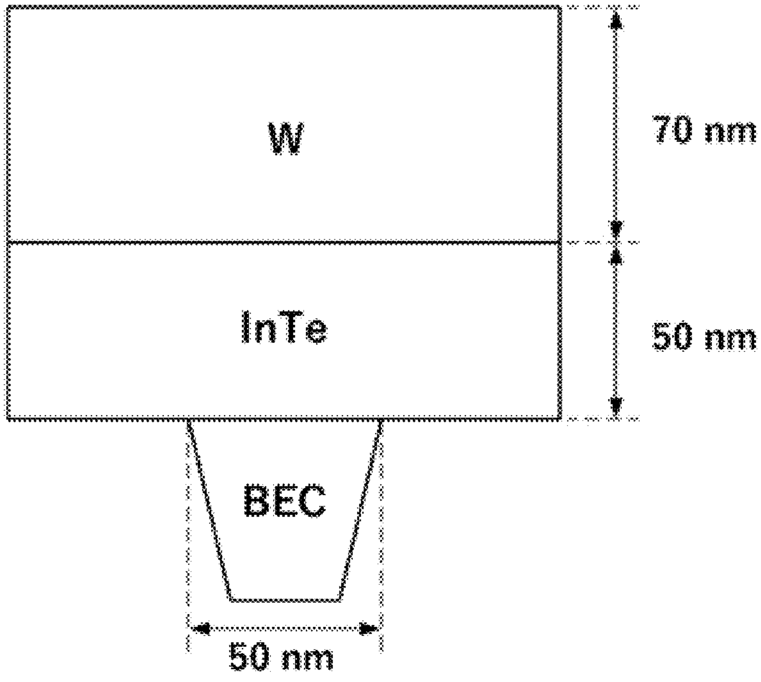
FIGS. 3A and 3B are a conceptual diagram for describing a memory device according to one embodiment of the invention.

A 50 nm thick electrode (top electrode) made of tungsten was formed on the formed InTe film. A schematic diagram of the fabricated SOM device is shown in FIG. 3A.

Example 2

Figure 3B:
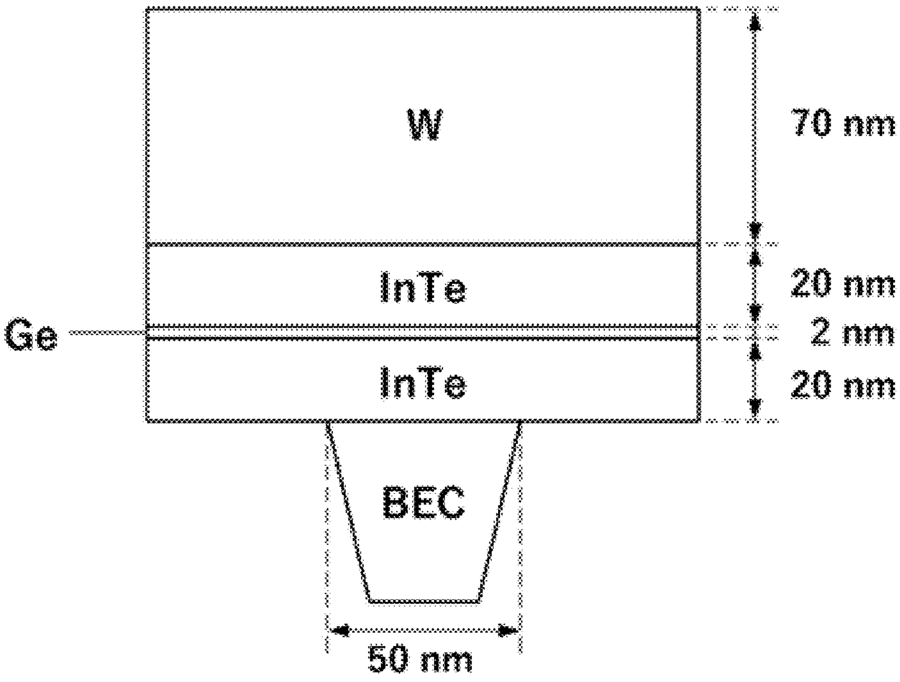

After forming the InTe film, a Ge film was formed with a thickness of 2 nm, and then an InTe film was formed again. A schematic diagram of the fabricated SOM device is shown in FIG. 3B.

Comparative Example 1

A device was manufactured in the same manner as in Example 1, but the InTe film was deposited with a higher In ratio so that a final composition ratio was In:Te=26.5:73.5 on an atom % basis.

Comparative Example 2

A device was manufactured in the same manner as in Example 1, but the InTe film was deposited with a higher In ratio so that a final composition ratio was In:Te=56.6:43.4 on an atom % basis.

Figure 4:
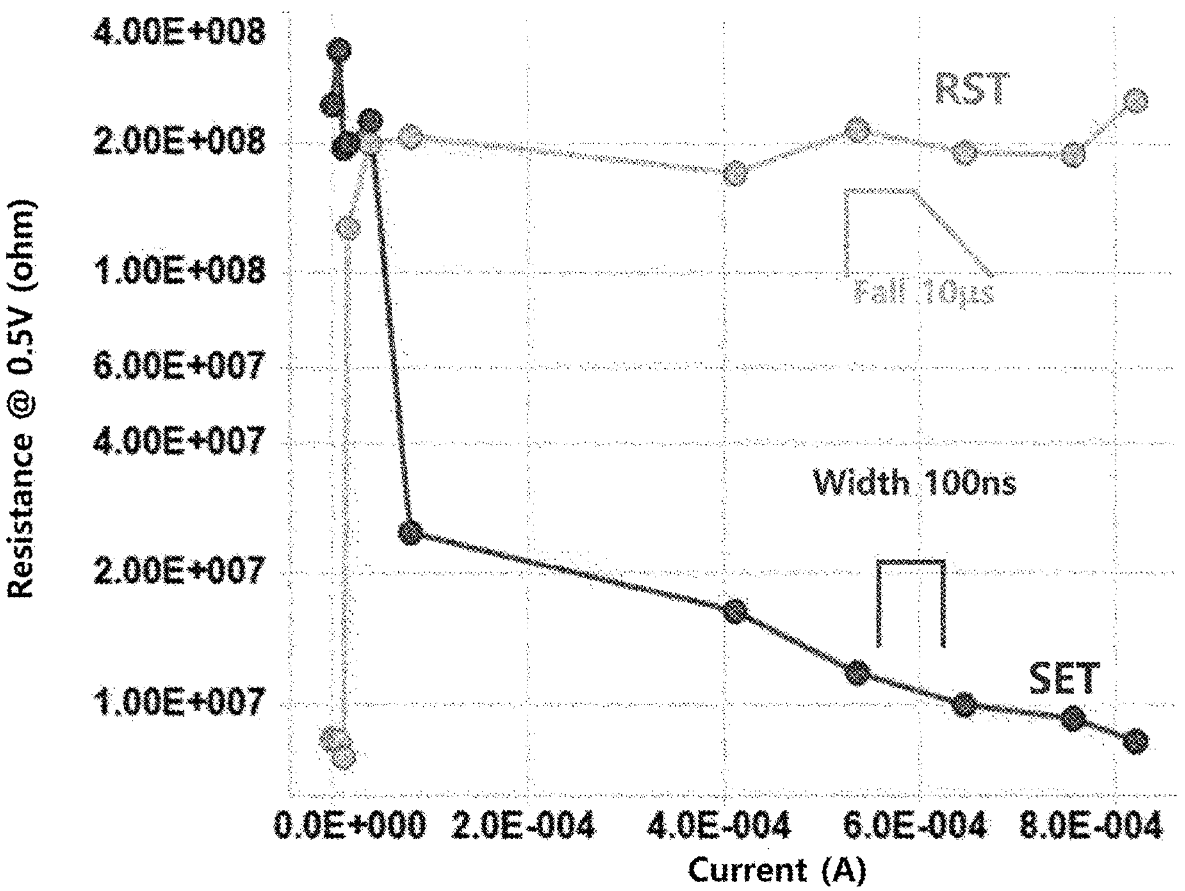
FIG. 4 is an R-I curve for describing the operation of the memory device according to one embodiment of the invention.

FIG. 4 shows an R-I curve for describing the operation of the SOM device according to Example 1. For a reset state (RST) indicating high a resistance, a trailing pulse having a voltage drop time of 10 μs and a current size of 40 μA was applied. In addition, a square pulse was applied for the set state (SET), which is a low resistance state. An application time of the square pulse was 100 ns and the current size was 80 μA. It was found that as the trailing pulse was applied, the resistance of the device significantly increased to enter the SOM device into the reset state (RST), and as the square pulse was applied, the resistance decreased to enter the SOM device into the set state (SET).

Figure 5:
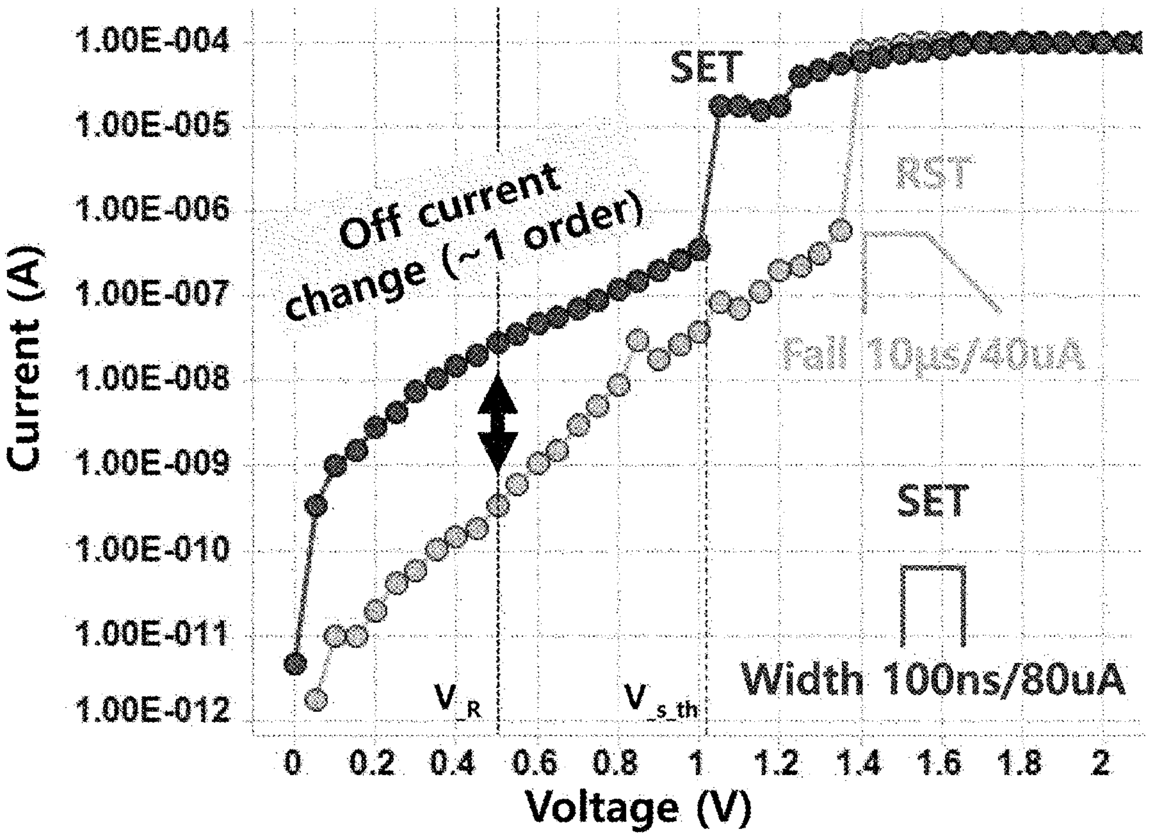
FIG. 5 is an I-V curve for describing the operation of the memory device according to one embodiment of the invention.

FIG. 5 shows an I-V curve in the SOM device according to Example 1. FIG. 5 shows the resistance state in the set state (SET) and the reset state (RST) depending on the pulse application as in FIG. 4. Since the change in resistance state is clearly evident depending on the application of different pulses, the SOM device may be utilized as the memory device. In particular, even when a reading voltage $V_{\_R}$ applied in a reading operation for determining the resistance state of the memory is lower than the threshold voltage $V_{\_s\_th}$ in the set state, which is a low resistance state, a resistance difference is so large that the resistance states in the set state and the reset state are distinguishable. By utilizing such a low level of voltage as the reading voltage, the power consumption for the operation of the device may be reduced.

Figure 6:
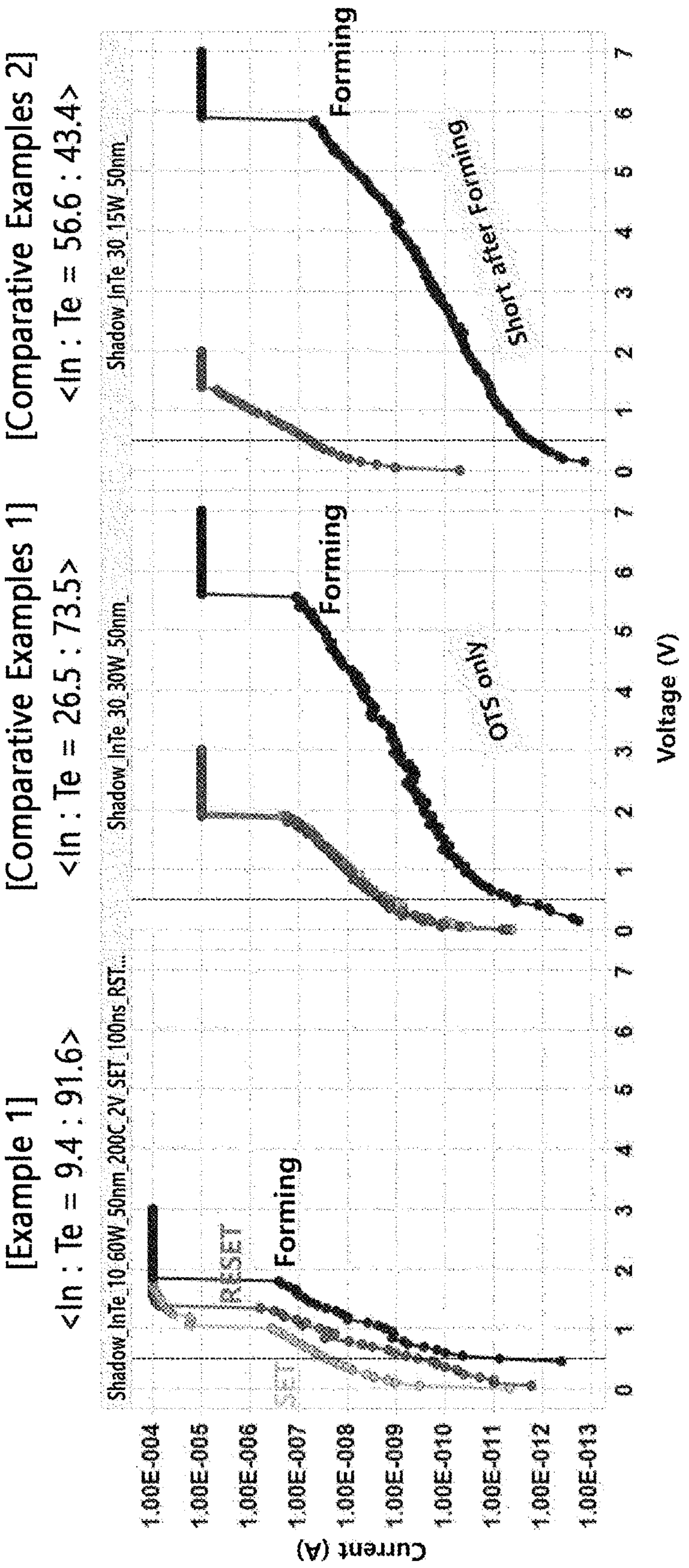
FIG. 6 is an I-V curve for describing the operation of the memory devices according to examples of the invention and comparative examples.

FIG. 6 is a result of comparing I-V curves when a pulse similar to that in FIG. 3 is applied to the SOM devices according to Example 1 and Comparative Examples 1 and 2. After a forming operation, it was found that only the SOM device according to Example 1 exhibited different resistance states in the set state (SET) and the reset state (RESET).

Figure 7:
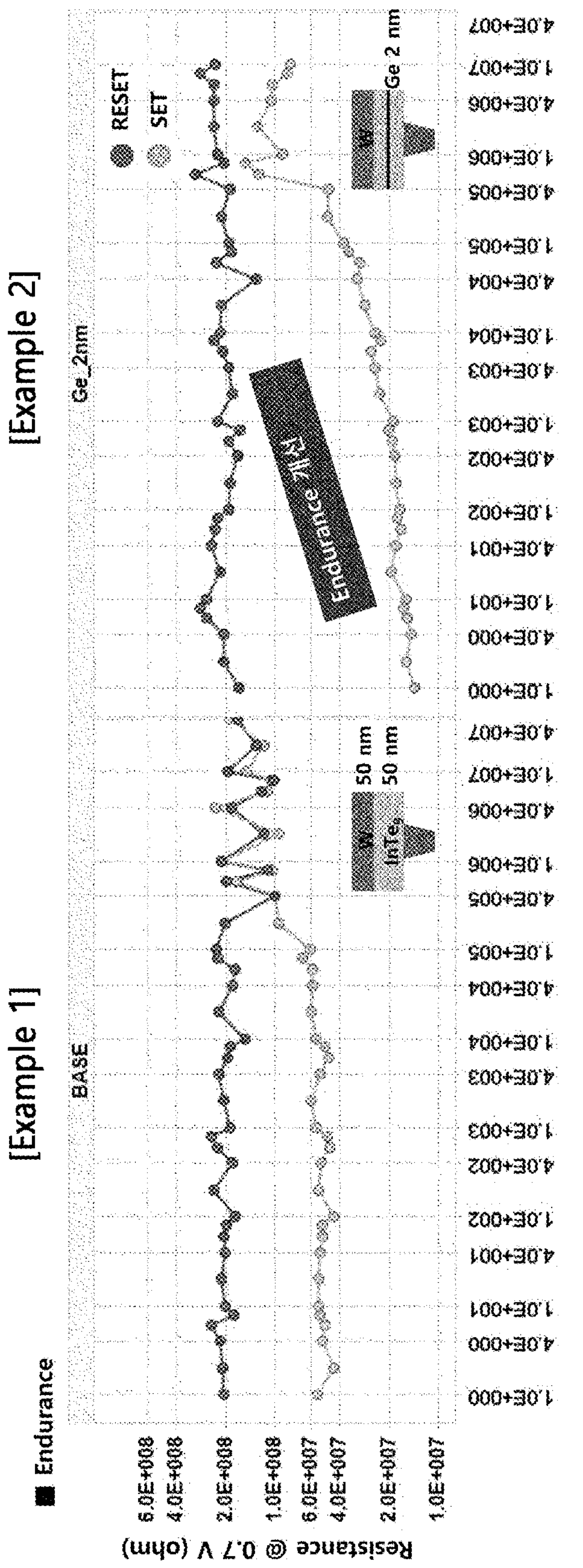
FIG. 7 is a graph showing results of measuring resistance changes according to the number of operations of the memory devices according to the examples of the invention.

FIG. 7 shows results of endurance evaluation according to operation of the SOM devices according to Examples 1 and 2. As the operation is repeated, the resistances of the set state and the reset state gradually overlap, and in the case of Example 2 where the Ge intermediate layer was formed, it can be seen that the number of operations at distinguishable levels appeared longer.

Figure 8:
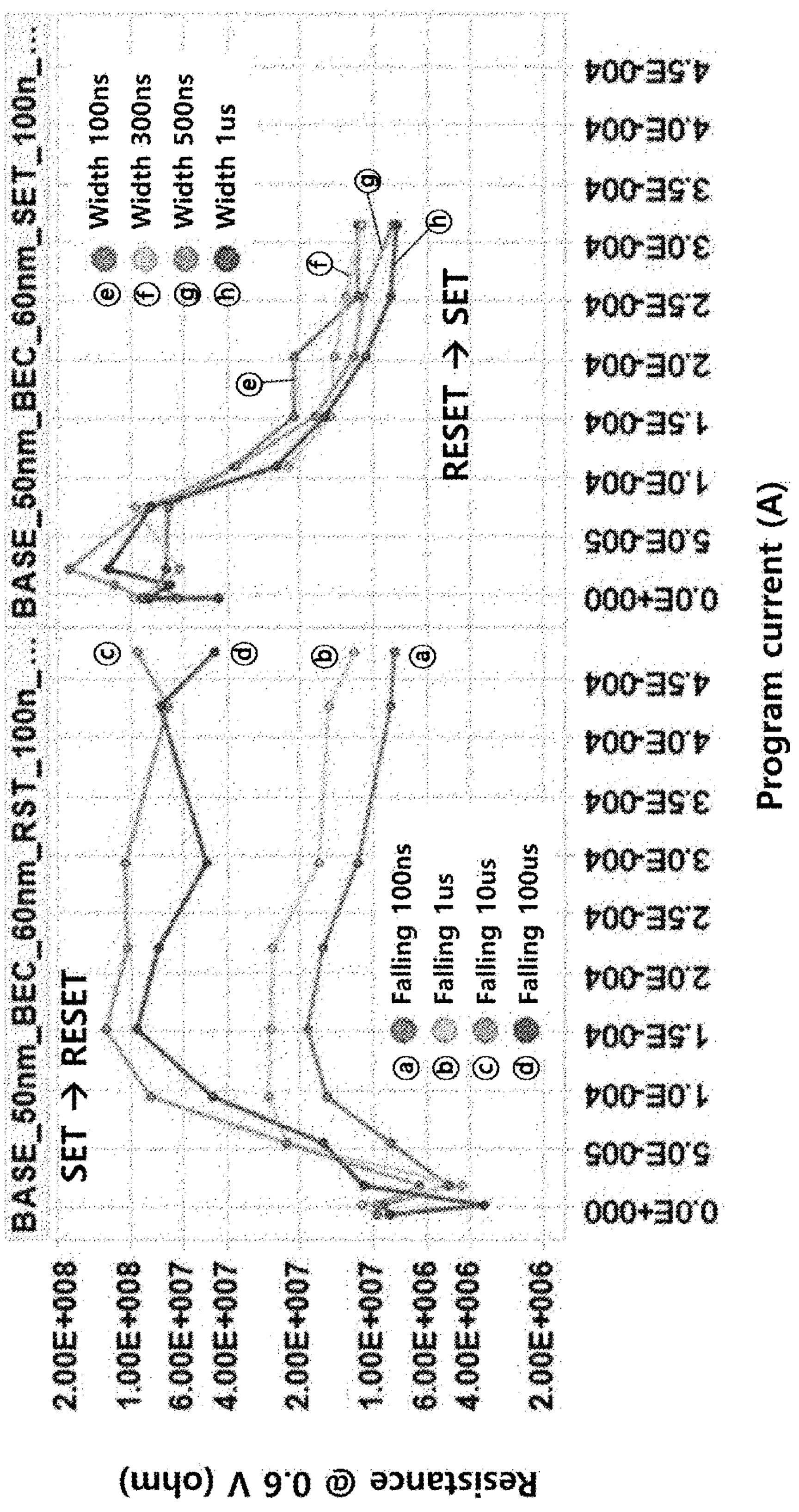
FIG. 8 is a graph showing changes in resistance of a memory device according to one embodiment of the invention according to applied pulses.

FIG. 8 shows results of measuring a change in resistance according to a voltage drop time in a trailing pulse applied when creating the reset state from the set state and a change in resistance according to a pulse width in a square pulse when creating the set state from the reset state. When creating the set state from the reset state, the change in resistance according to the pulse width of the square pulse was minimal, but when creating the reset state, a resistance change range became larger as the voltage drop time of the trailing pulse became longer. However, it can be seen that the resistance significantly changed even with the time as short as 100 ns.

Figure 9:
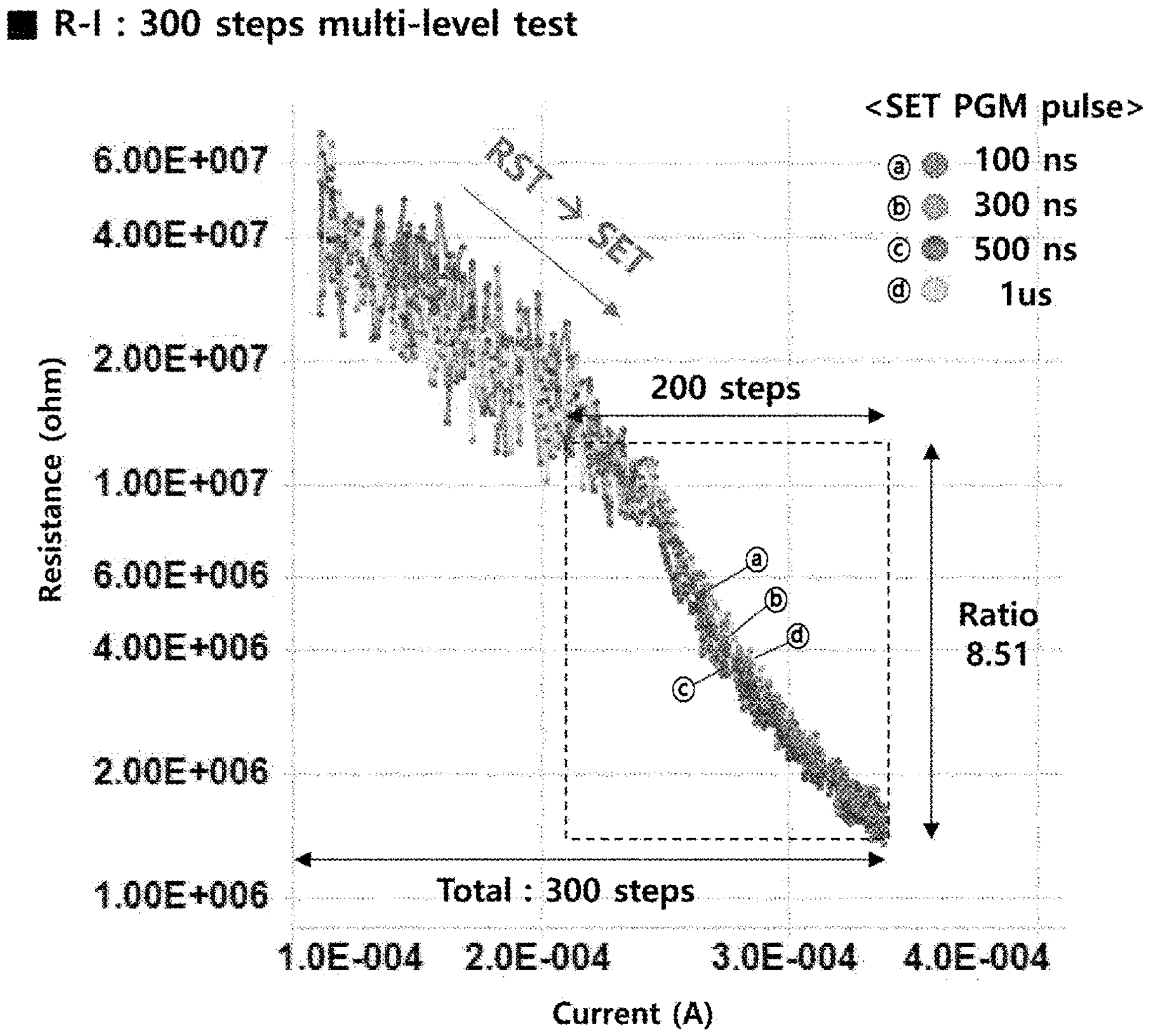
FIG. 9 is a graph for describing changes in resistance of the memory device according to a current size of a pulse applied to create a set state in the memory device according to one embodiment of the invention.

Meanwhile, the SOM device according to the invention may change the resistance of the set state by changing the current size or pulse number of the square pulse when creating the set state, which is shown in FIG. 9. FIG. 9 shows changes in resistance of the SOM device of Example 1 according to the current size of a square pulse applied when changing from the reset state to the set state. It can be seen that, regardless of the duration of the square pulse, the resistance decreased stepwise as the current size increased, and in particular, a distinguishable 200-step resistance change can be induced in a low-noise region. Through the gradual change in resistance, the applicability as the memory device for analog operations can be confirmed.

A memory device having a 3D cross-point structure can be manufactured with a simple structure using a memory device according to the invention, so that it is possible to configure a high-density memory cell for storing a large amount of information.

What is claimed is:

1. A memory device comprising a chalcogenide compound layer, wherein the chalcogenide compound layer comprises a first element selected from the group consisting of Al, Ga, In, and a combination thereof, and a second element selected from the group consisting of S, Se, Te, and a combination thereof, an atomic molar ratio of the first element is in a range of 1 to 15 atom %, and a resistance changes depending on different pulse waveforms of the same polarity that are applied to simultaneously have switching characteristics.

2. The memory device according to claim 1, wherein the chalcogenide compound layers are stacked in a multilayer structure.

3. The memory device according to claim 2, wherein an intermediate layer including one or both of Ge and Si is disposed between the chalcogenide compound layers of the multilayer structure.

4. The memory device according to claim 2, wherein an amorphous carbon layer is disposed between the chalcogenide compound layers of the multilayer structure.

5. The memory device according to claim 1, wherein the chalcogenide compound layer further comprises one or both of Ge and Si, and a sum of Ge and Si is greater than 0 and less than or equal to 5 atom %.

6. The memory device according to claim 1, wherein the atomic molar ratio of the first element is 5 to 10 atom %.

7. The memory device according to claim 1, wherein the first element is In and the second element is Te.

8. The memory device according to claim 1, wherein the selector has a first resistance when the pulse waveform is a square pulse, the selector has a second resistance when the pulse waveform is a trailing pulse, and the first resistance is lower than the second resistance.

9. A method of operating a memory device including a chalcogenide compound layer including a first element selected from the group consisting of Al, Ga, In, and a combination thereof, and a second element selected from the group consisting of S, Se, Te, and a combination thereof, an atomic molar ratio of the first element being 1 to 15 atom %, the method comprising:

writing a first logic state by applying a square pulse of a first polarity to the memory device; and writing a second logic state by applying a trailing pulse of a first polarity to the memory device, wherein a resistance of the first logic state is smaller than a resistance of the second logic state.

10. The method according to claim 9, wherein a voltage drop time in the trailing pulse is in a range of 50 ns to 500 μs.

11. The method according to claim 9, wherein the resistance of the first logic state is changed by changing a current size or the pulse number of the square pulses applied in the writing of the first logic state.

12. The method according to claim 11, wherein the applied square pulse controls the resistance of the first logic state to be low by gradually increasing a current size as the pulse number increases.

13. The method according to claim 9, comprising reading by applying a reading voltage that is lower than or equal to a threshold voltage of the memory device in the first logic state and has the first polarity to the memory device in which the first or second logic state is written.

* * * * *